United States Patent
Bosnyak et al.

(10) Patent No.: US 6,313,659 B1
(45) Date of Patent: Nov. 6, 2001

(54) CONTROLLED IMPEDANCE CMOS RECEIVER FOR INTEGRATED CIRCUIT COMMUNICATION BETWEEN CIRCUITS

(75) Inventors: Robert J. Bosnyak, San Jose; Jose M. Cruz; Robert L. Drost, both of Palo Alto, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/667,473

(22) Filed: Dec. 27, 2000

(51) Int. Cl.[7] .................................................. H03K 17/16
(52) U.S. Cl. ................................. 326/30; 326/83; 326/86
(58) Field of Search .................................. 326/30, 83, 86, 326/26, 27

(56) References Cited

U.S. PATENT DOCUMENTS

| | | | |
|---|---|---|---|
| 4,719,369 | * | 1/1988 | Asano et al. ............................ 326/30 |
| 5,134,311 | * | 7/1992 | Biber et al. ............................. 326/30 |
| 5,498,990 | * | 3/1996 | Leung et al. .......................... 327/323 |
| 6,072,331 | * | 6/2000 | Takizawa ................................ 326/30 |
| 6,211,714 | * | 4/2001 | Jeong .................................... 327/293 |

* cited by examiner

*Primary Examiner*—Michael Tokar
*Assistant Examiner*—Don Phu Le
(74) *Attorney, Agent, or Firm*—Townsend and Townsend and Crew, LLP

(57) ABSTRACT

A CMOS impedance matching circuit includes an amplifier and a feedback circuit. The amplifier allows control of the impedance by controlling the V/I characteristic. The amplifier is sized to provide the desired impedance. The feedback circuit clamps the maximum excursions of the input signal, thereby maximizing signal speed. It also provides a higher impedance to noise beyond the dead band. In one embodiment of the present invention, the amplifier includes an amplifier circuit in parallel with an amplifier buffer. The amplifier buffer provides no gain and simply performs the inverting function when no gain is required for impedance matching. In one embodiment, the amplifier circuit includes a plurality of switchable amplifiers coupled in parallel with each other. Each of the switchable amplifiers has a different gain, and the one with the right amount of gain for the needed impedance matching is chosen using control inputs. Each of the switchable amplifiers is preferably constructed using pull up and pull down circuits, which ensure that the voltage is within the compliance range of the remote driver circuit. In the absence of an input, the feedback circuit biases the transmission line to the trigger level of the remote receiver circuit, ensuring a quick response when an input is received.

15 Claims, 10 Drawing Sheets

CONTROLLED IMPEDANCE CMOS RECEIVER FOR INTEGRATED CIRCUIT COMMUNICATION BETWEEN CIRCUITS

BACKGROUND OF THE INVENTION

The present invention relates generally to chip to chip communications, and, particularly to matching the input impedance of a receiver circuit in a first chip with the output impedance of a driver circuit in a second chip and with the characteristic impedance of a transmission line coupling the driver circuit to the receiver circuit.

As signal rates increase in integrated circuit (chip) technology, many of the chip to chip communications require matched impedances between the driver circuits and the receiver circuits on chips. This is required in order to achieve maximum data transfer rates between a driver circuit and a receiver circuit and to reduce reflection of data signals in the transmission line which couples the driver circuit to the receiver circuit.

An ideal driver-receiver system would consist of a remote driver circuit, a transmission line, and a receiver circuit. In such an ideal driver-receiver system, the driver circuit is a source pulse generator which has a Thevenin equivalent output impedance, $Z_{Do}$, matching the characteristic impedance, $Z_{To}$, of the transmission line and matching the input impedance, $Z_{Ro}$, of the receiver circuit.

Realistically, a non-ideal driver-receiver system implementing chip to chip communication includes a remote driver circuit, a transmission line, an impedance matching circuit, and a receiver circuit. The impedance matching circuit matches the input impedance of a receiver circuit with the output impedance of the remote driver circuit and with the characteristic impedance of the transmission line.

For example, FIG. 1 shows a block diagram of a driver-receiver system 100 which includes an impedance matching circuit 130. Driver-receiver system 100 includes a remote driver circuit 110 coupled to transmission line 120, which is coupled to impedance matching circuit 130, which in turn is coupled to receiver circuit 140. Remote driver circuit 110 receives an original data signal, A, and outputs a driver data signal, $A_D$, to transmission line 120. Transmission line 120 transmits driver data signal $A_D$ and outputs transmission data signal $A_T$ to impedance matching circuit 130. Impedance matching circuit 130 outputs an impedance-matched data signal, $A_{IM}$, to receiver circuit 140. Receiver circuit 140 outputs a receiver data signal, $A_R$.

FIG. 2A shows a first type of known driver-receiver system 210 which includes a first type of known impedance matching circuit 130. This first type of known impedance matching circuit 130 includes a first resistor 220, a second resistor 230, and an inverter 240. In one case, first resistor 220 and second resistor 230 are external termination resistors which are discrete resistors added to the printed circuit board (PCB) on which the chip with remote driver circuit 110 and the chip with receiver circuit 140 are mounted. In another case, first resistor 220 and second resistor 230 are fabricated into the package that supports the chip with receiver circuit 140 and make the electrical connections available to the PCB wires. In both cases, the parallel combination of the resistances of first resistor 220 and second resistor 230 is set to generate an input impedance for receiver circuit 140 which matches the output impedance of remote driver circuit 110 and the characteristic impedance of transmission line 120. However, system 210 which includes impedance matching circuit 130 poses several problems. For example, system 210 requires additional work for mounting first resistor 220 and second resistor 230 either on the PCB or in the package which supports the chip with receiver circuit 140. In addition, system 210 less reliably maintains the input impedance for receiver circuit 140 constant because of the external connections required between the chip with receiver circuit 140 and either the PCB or the package which supports the chip with receiver circuit 140.

Other types of known driver receiver systems exist which are similar to the first type of known driver-receiver system 210. For example, instead of using discrete resistors to generate the input impedance of receiver circuit 140, bipolar transistors are used to generate the input impedance of receiver circuit 140. In that case, the bipolar transistors are configured as resistors and take the place of first resistor 220 and second resistor 230 in system 210. In another example, PMOS transistors configured as resistors are used. Both of these alternative versions pose several problems First, they do not effectively maintain the input impedance of receiver circuit 140 constant over temperature. Also, they do not effectively compensate for process variations in the manufacturing of the chips which the impedance matching circuit 130 is supposed to interact with.

FIG. 2B shows a second type of known driver-receiver system 250 which includes a second type of known impedance matching circuit 130. This second type of known impedance matching circuit 130 includes a first transistor 260, a second transistor 270, and an inverter 280. A control signal biases first transistor 260 such that the parallel combination of first transistor 260 and second transistor 270 generates an input impedance for receiver circuit 140 which matches the output impedance of remote driver circuit 110 and the characteristic impedance of transmission line 120. However, system 250 also is subject to problems with temperature and process variations.

For the foregoing reasons, an impedance matching circuit which maintains the input impedance of the receiver circuit constant over temperature variations and over process variations, without the use of external resistors, would greatly benefit chip to chip communications.

SUMMARY OF THE INVENTION

The present invention provides a CMOS impedance matching circuit with an amplifier and a feedback circuit. The amplifier allows control of the impedance by controlling the V/I characteristic. The amplifier is sized to provide the desired impedance. The feedback circuit clamps the maximum excursions of the input signal, thereby maximizing signal speed. It also provides a high impedance dead band to increase the noise margin.

In one embodiment of the present invention, the amplifier includes an amplifier circuit in parallel with an amplifier buffer. The amplifier buffer provides no gain and simply performs the inverting function when no gain is required for impedance matching.

In one embodiment, the amplifier circuit includes a plurality of switchable amplifiers coupled in parallel with each other. Each of the switchable amplifiers has a different gain, and the one with the right amount of gain for the needed impedance matching is chosen using control inputs. Each of the switchable amplifiers is preferably constructed using pull up and pull down circuits, which ensure that the voltage is within the compliance range of the remote driver circuit.

In the absence of an input, the feedback circuit biases the transmission line to the trigger level of the remote receiver circuit, ensuring a quick response when an input is received.

The invention will be better understood by reference to the following detailed description in connection with the following drawings.

DESCRIPTION OF THE PREFERRED EMBODIMENT

In the description that follows, the present invention is explained in reference to a prefer-red embodiment. The description of the prefer-red embodiment that follows is intended to be illustrative, but not limiting, of the scope of the present invention as set forth in the claims.

Figure 3:
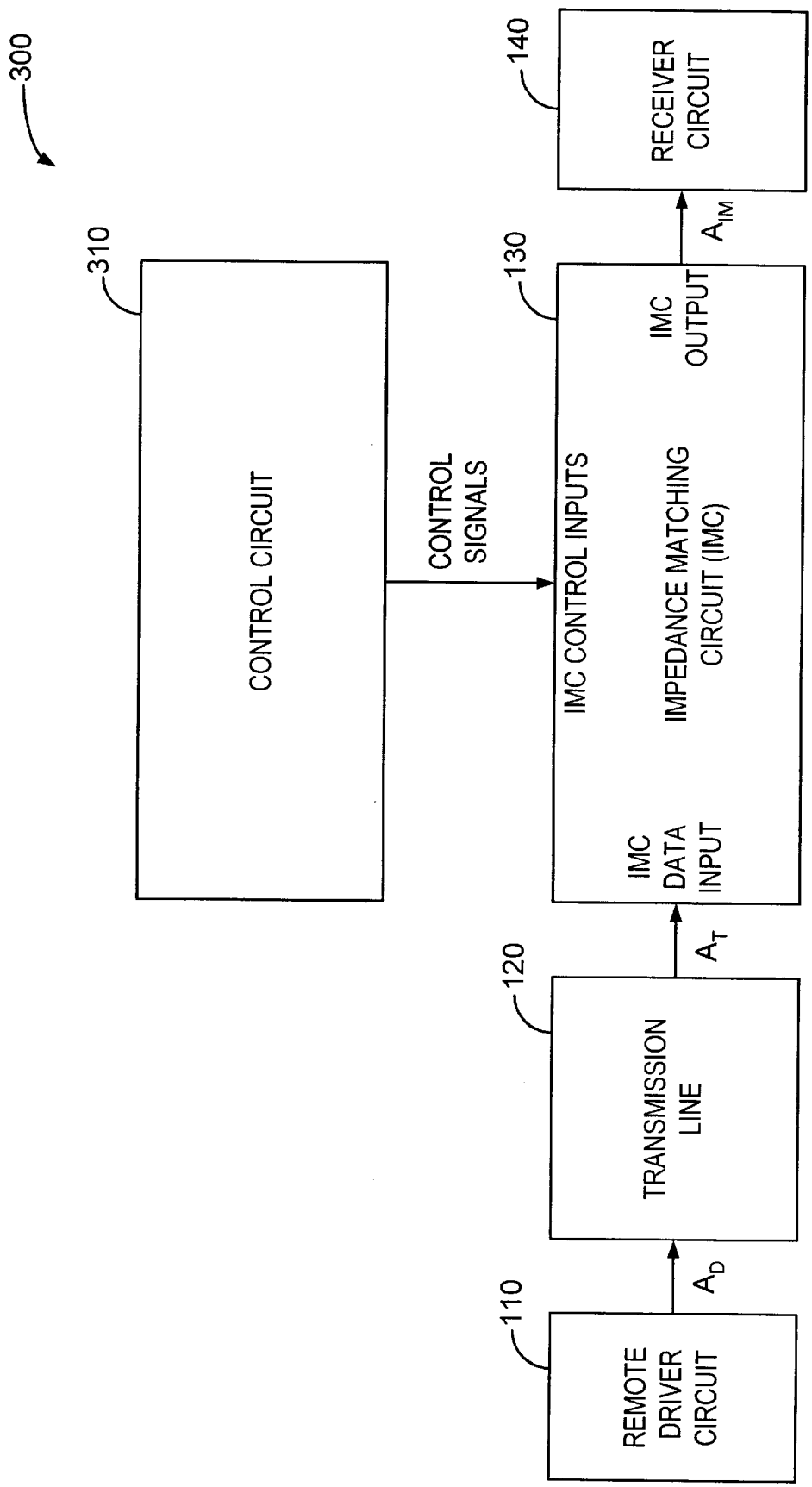
FIG. 3 is a block diagram of a driver-receiver system which includes a CMOS impedance matching circuit according to the present invention.

FIG. 3 shows a block diagram of a driver-receiver system 300 which includes a CMOS impedance matching circuit 130 according to the present invention. Driver-receiver system 300 includes a remote driver circuit 110 coupled to a transmission line 120, which is coupled to a CMOS impedance matching circuit 130, which in turn is coupled to a control circuit 310 and to a receiver circuit 140. Remote driver circuit 110 outputs a driver data signal, $A_D$, to transmission line 120. Transmission line 120 transmits a driver data signal $A_D$ and outputs a transmission data signal $A_T$ to CMOS impedance matching circuit 130. CMOS impedance matching circuit 130 receives transmission data signal $A_T$ at its CMOS impedance matching circuit input 121, receives control signals at its CMOS impedance matching circuit control inputs 123, and outputs at its CMOS impedance matching circuit output 125 an impedance-matched data signal, $A_{IM}$, to receiver circuit 140.

Figure 4:
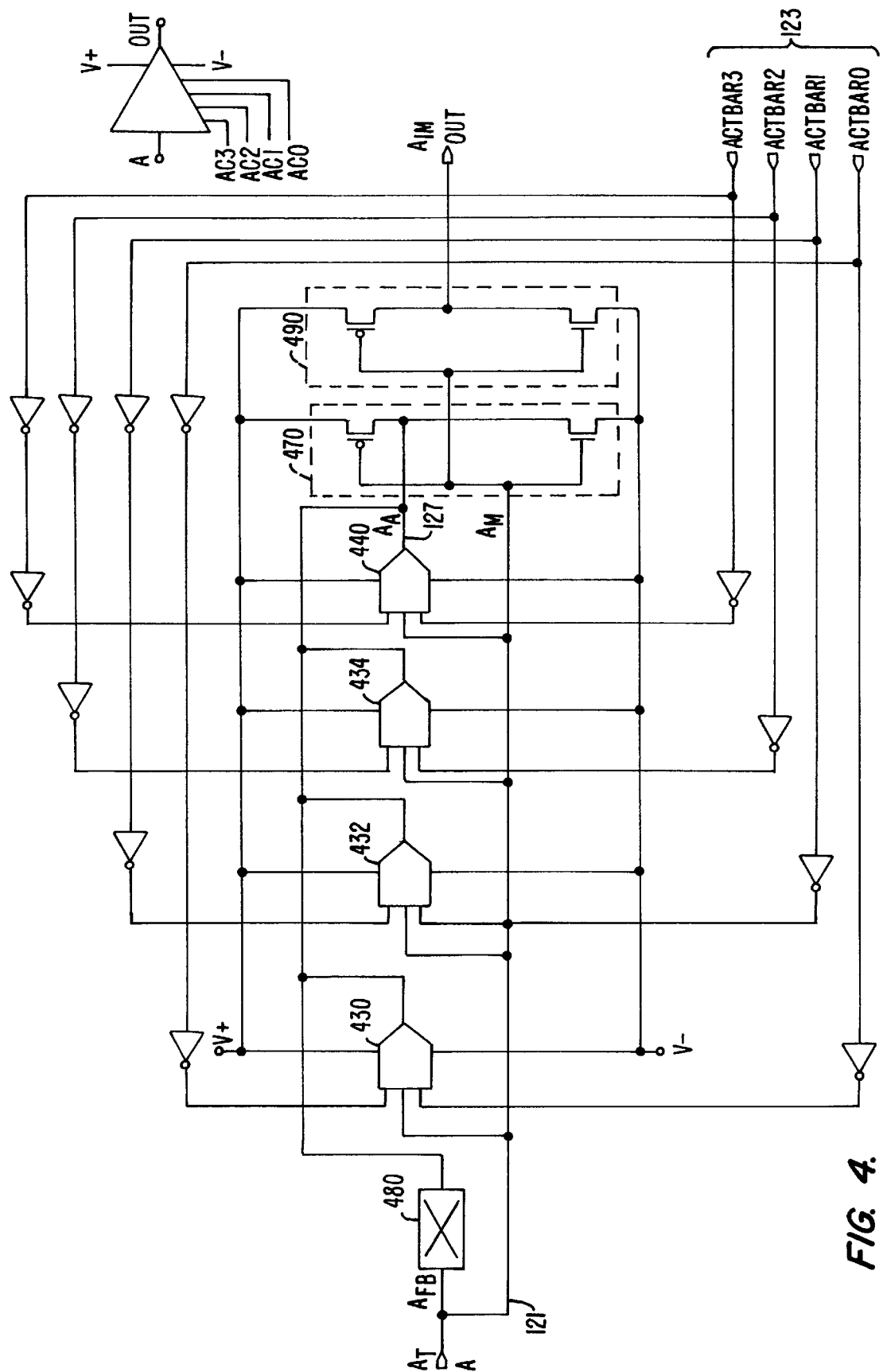
FIG. 4 is a block diagram of the CMOS impedance matching circuit of FIG. 3.

FIG. 4 shows a block diagram of an embodiment of the CMOS impedance matching circuit 130 of FIG. 3. CMOS impedance matching circuit 130 includes switchable amplifiers 430, 432, 434 and 440, an amplifier buffer 470, a feedback circuit 480, and an impedance buffer 490. CMOS impedance matching circuit 130 receives transmission data signal $A_T$ at its input 121. The switchable amplifiers amplify transmission data signal $A_T$ by an amount of gain selected by control signals at control inputs 123, and output an amplifier data signal $A_A$ at node 127. Feedback circuit 480 receives amplifier data signal $A_A$ and provides a feedback data signal, $A_{FB}$, at input 121. Input $A_T$, as modified by feedback data signal $A_{FB}$, is provided as modified data signal $A_M$ through impedance buffer 490 to give an impedance-matched data signal $A_{IM}$. In a specific embodiment, impedance buffer 490 is an inverter.

The switchable amplifiers and amplifier buffer 470 are in parallel. In a specific embodiment, amplifier buffer 470 is an inverter. The switchable amplifiers 430, 432, 434 and 440 are coupled in parallel with each other. Each of these switchable amplifiers receives transmission data signal $A_T$ at input 121 and control signals at control inputs 123 and outputs a switchable amplifier data signal at node 127. Each of these switchable amplifiers is independently selectable by the control inputs 123. In a specific embodiment, each of these switchable amplifiers has a different gain.

In one situation, depending on these received control signals, the switchable amplifiers amplify the transmission data signal $A_T$ to generate an impedance-matched data signal, $A_{IM}$.

In the alternative situation, the switchable amplifiers are off, and do not help CMOS impedance matching circuit 130 to generate an impedance matched data signal $A_{IM}$.

Switchable Amplifier

Figure 5:
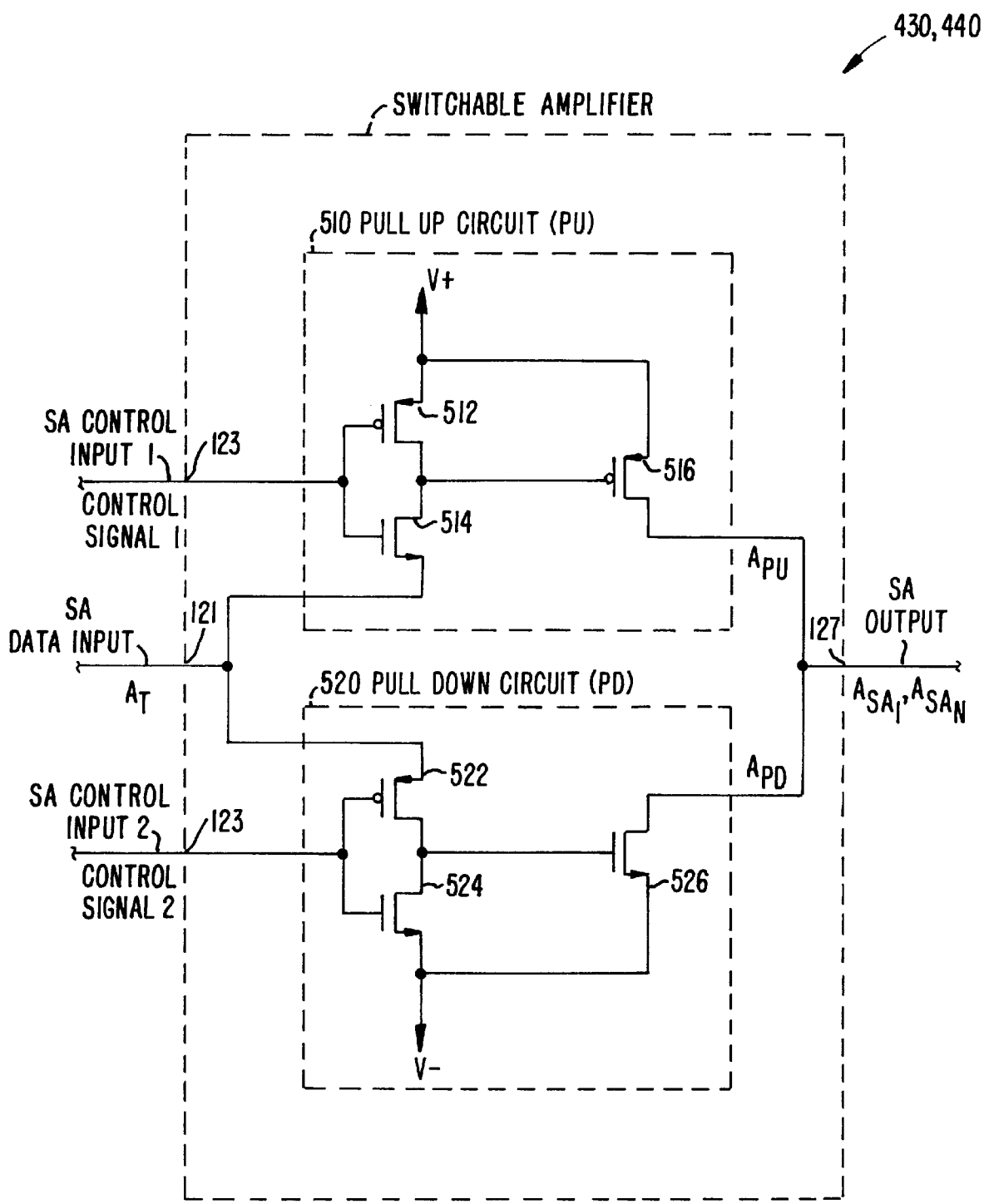
FIG. 5 is a circuit diagram of one embodiment of a switchable amplifier of FIG. 4.

FIG. 5 shows a circuit diagram of one embodiment of a switchable amplifiers 430, 432, 434 or 440 of FIG. 4. In an embodiment of the invention, a switchable amplifier includes a pull up circuit 510 and pull down circuit 520. Pull up circuit 510 is coupled to a first supply voltage, to one of the control inputs 123, to amplifier input 121, and to amplifier output 127. Pull down circuit 520 is coupled to a second supply voltage, to another one of the control inputs 123, to amplifier input 121, and to amplifier output 127.

Pull Up and Pull Down Circuits

Pull Up Circuit

In a specific embodiment, pull up circuit 510 includes a first transistor 512 of a first polarity, a second transistor 514 of a second polarity, and a third transistor 516 of the first polarity. First transistor 512 has a source coupled to the first supply voltage, a gate coupled to one of the control inputs 123, and a drain. In a specific embodiment, first transistor 512 is a PMOS transistor. Second transistor 514 has a drain coupled to the drain of the first transistor, a gate coupled to the one of the control inputs 123, and a source coupled to amplifier input 121. In a specific embodiment, second transistor 514 is an NMOS transistor. Third transistor 516 has a source coupled to the first supply voltage, a gate coupled to the drain of the first transistor and to the drain of the second transistor, and a drain coupled to amplifier output 127. In a specific embodiment, third transistor 516 is a PMOS transistor. In a further embodiment, the first supply voltage is within the compliance range of the voltage supply of remote driver circuit 110. In a further embodiment, the first supply voltage is a positive supply voltage.

Pull Down Circuit

Pull down circuit 520 includes a first transistor 522 of a first polarity, a second transistor 524 of a second polarity, and a third transistor 526 of the second polarity. First transistor 522 has a source coupled to amplifier input 121, a gate coupled to one of the control inputs 123, and a drain. In a specific embodiment, first transistor 522 is a PMOS transistor. Second transistor 524 has a drain coupled to the drain of the first transistor, a gate coupled to the one of the control inputs 123, and a source coupled to the second supply voltage. In a specific embodiment, second transistor 524 is a NMOS transistor. Third transistor 526 has a drain coupled to amplifier output 127, a gate coupled to the drain of the first transistor and to the drain of the second transistor, and a source coupled to the second supply voltage. In a specific embodiment, third transistor 526 is a NMOS transistor. In a further embodiment, the second supply voltage is within the compliance range of the voltage supply of remote driver circuit 110. In a further embodiment, the second supply voltage is a negative supply voltage. In a further embodiment, the second supply voltage is ground.

Operation of Switchable Amplifier

Modifiable Gain

For a particular switchable amplifier, if control signal 1 is high, and, thereby, pull up circuit 510 is on, and if control signal 2 is low, and, thereby, pull down circuit 520 is on, then the switchable amplifier is on and amplifies by its particular gain transmission data signal $A_T$ and inverts transmission data signal $A_T$. The selection of one switchable amplifier to be turned on or the selection of a set of switchable amplifiers to be turned on can provide the gain needed for impedance matching and that is modifiable. In a specific embodiment, the control signals are generated by another circuit. In another embodiment, the control signals are preset by a user. In a further embodiment the output impedance of remote driver circuit 110 is measured and the characteristic impedance of transmission line 120 is measured. Based upon these measurements, the control signals are set to select one switchable amplifier or a group of certain switchable amplifiers to provide an impedance which matches the output impedance and the transmission line impedance.

In a specific embodiment, for the switchable amplifiers, the ratio of the size of the third transistor 516 of pull up circuit 510 to the size of the third transistor 526 of pull down circuit 520 is selected such that the ratio of the mobility of transistor 516 to the mobility of transistor 526 ranges from 3:2 to 3:1 to 2:1. For a particular switchable amplifier, the difference between the mobility of transistor 516 and the mobility of transistor 526 results in a particular gain for that switchable amplifier and a particular impedance for that switchable amplifier. In a specific embodiment, for the switchable amplifiers, the ratio of the size of the third transistor 516 of pull up circuit 510 to the size of the third transistor 526 of pull down circuit 520 is selected so as provide a different gain for each of the switchable amplifiers.

Impedance Matching

When current, i, needs to be sourced for impedance matching, transistor 514 is turned on to source the appropriate amount of current, i, for the current-voltage, i-v, characteristic of the desired matched impedance. When current, i, needs to be sunk for impedance matching, transistor 522 is turned on to sink an appropriate amount of current, i, for the current-voltage, i-v, characteristic of the desired matched impedance.

Compliance Range

Because the first supply voltage of pull up circuit 510 is within the compliance range of the voltage supply of remote driver circuit 110 and the second supply voltage of pull down circuit 520 is within the compliance range of the voltage supply of remote driver circuit 110, when a switchable amplifier is turned on, the switchable amplifier sources current and sinks current at voltage levels which are within the compliance range of the voltage supply of remote driver circuit 110.

Current-Voltage Characteristics of Driver-Receiver Systems

Figure 7:
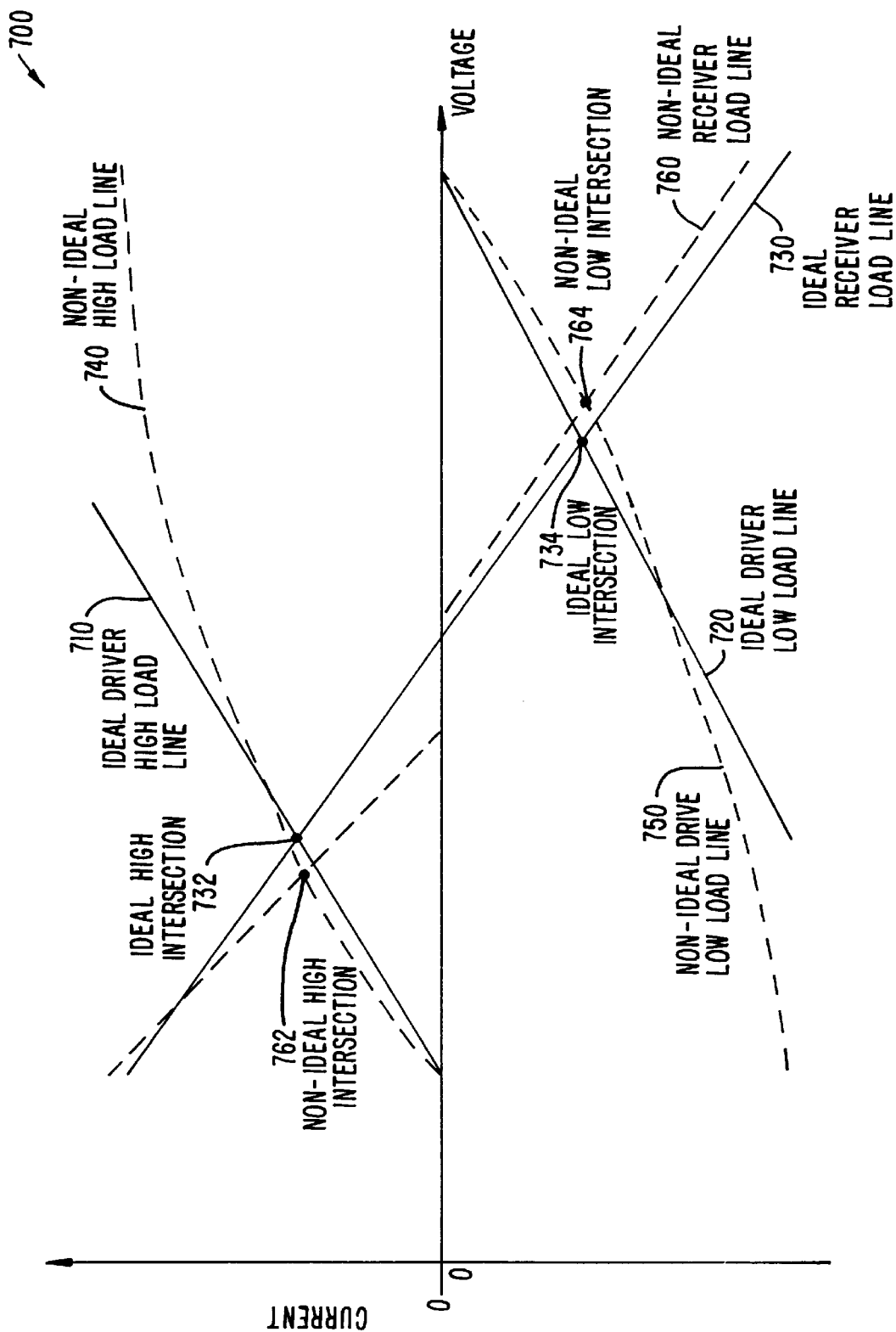
FIG. 7 shows the current-voltage characteristic of an ideal driver-receiver system and of a non-ideal driver-receiver system, which includes a CMOS impedance matching circuit according to the present invention.

FIG. 7 shows the current-voltage characteristic 700 of an ideal driver-receiver system and of a non-ideal driver-receiver system 100, which includes a CMOS impedance matching circuit 130 according to the present invention. Current-voltage characteristics 700 includes an ideal driver high load line 710 (the driver load line when driver data signal, $A_D$, is a high voltage), an ideal driver low load line 720 (the driver load line when driver data signal, $A_D$, is a low voltage), an ideal receiver load line 730, a non-ideal driver high load line 740 (the driver load line when driver data signal, $A_D$, is a high voltage), a non-ideal driver low load line 750 (the driver load line when driver data signal, $A_D$, is a low voltage), and a non-ideal receiver load line 760. In an ideal driver receiver system, the input impedance of a receiver circuit would match the output impedance of a remote driver circuit and the characteristic impedance of a transmission line coupling the remote driver circuit to the receiver circuit. This ideal case is demonstrated by an ideal high intersection 732 of ideal driver high load line 710 and ideal receiver load line 730 and by an ideal low intersection 734 of ideal driver low load line 720 and ideal receiver load line 730.

Figure 1:
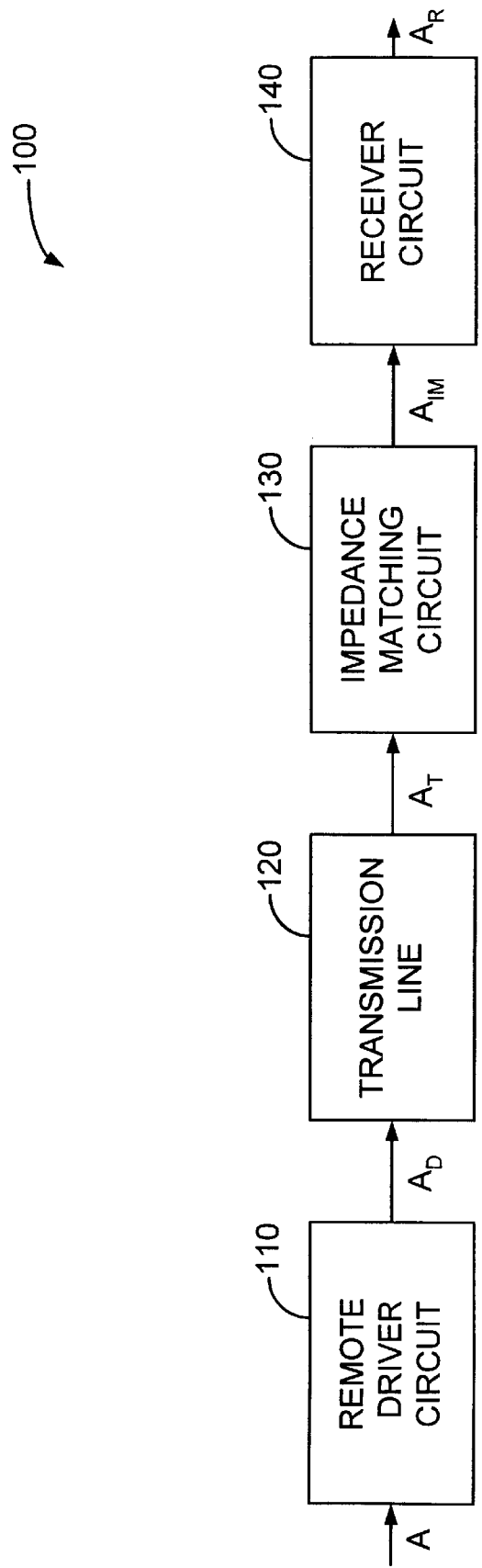
FIG. 1 is a block diagram of a prior art driver-receiver system which includes an impedance matching circuit.
Figure 2A:
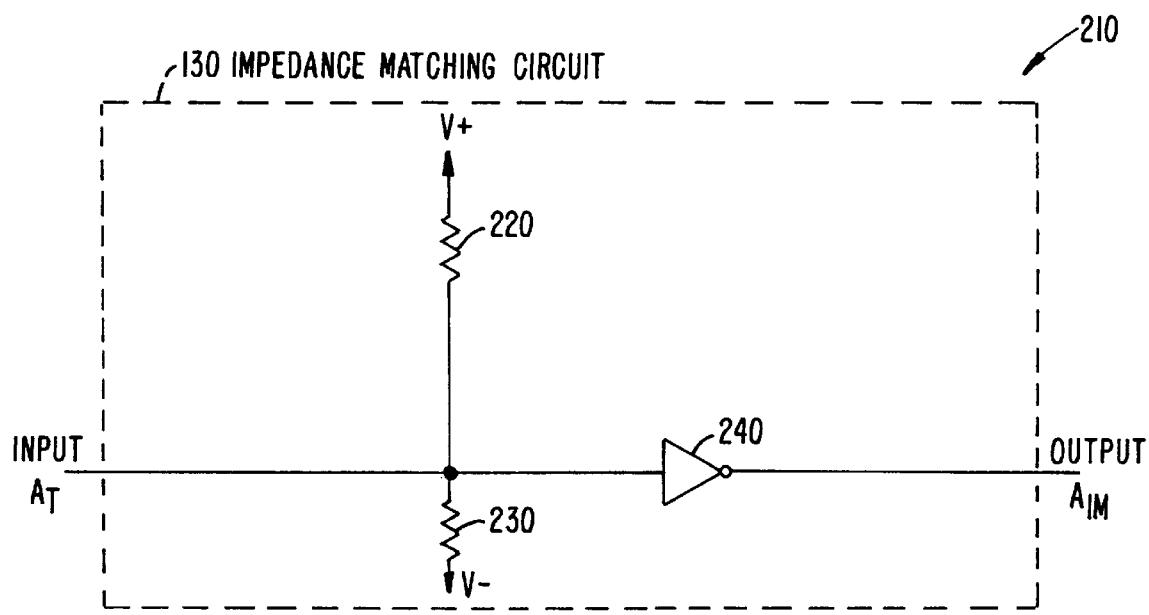
FIG. 2A is a circuit diagram of a first type of prior art driver-receiver system which includes a first type of prior art impedance matching circuit.
Figure 2B:
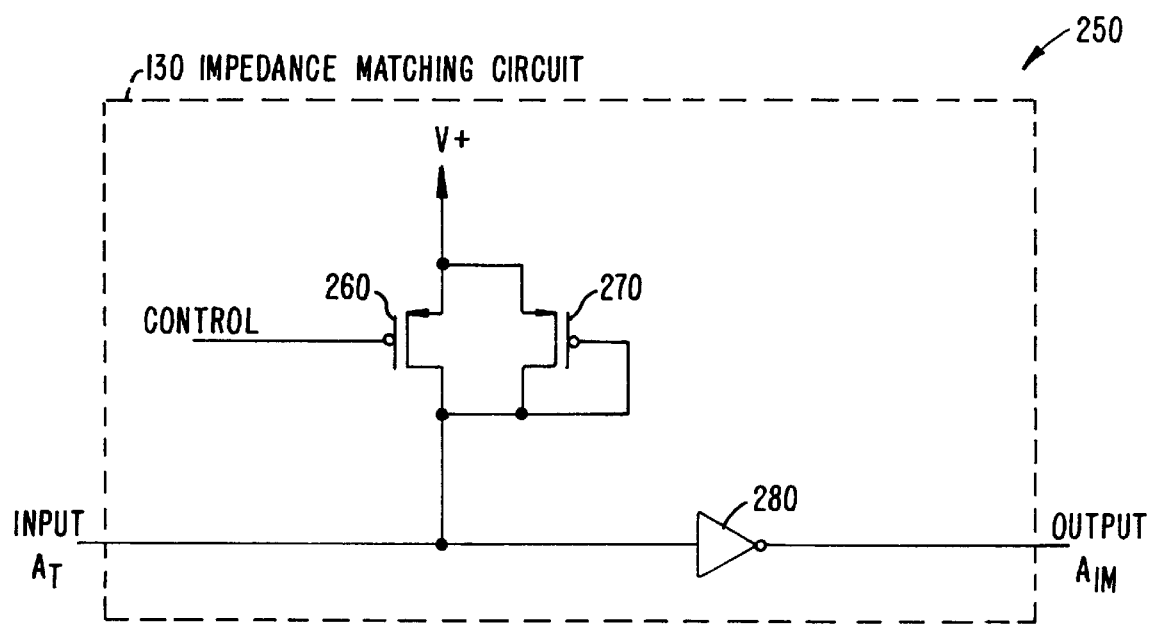
FIG. 2B is a circuit diagram of a second type of prior art driver-receiver system which includes a second type of prior art impedance matching circuit.

In a non-ideal driver-receiver system 100, as shown in FIG. 1, the input impedance of receiver circuit 140 does not quite match the output impedance of remote driver circuit 110 and does not quite match the characteristic impedance of transmission line 120. This non-ideal case is demonstrated by a non-ideal high intersection 762 of non-ideal driver high load line 740 and non-ideal receiver load line 760 and by a nonideal low intersection 764 of non-ideal driver low load line 750 and non-ideal receiver load line 760. CMOS impedance matching circuit 130 acts to minimize the distance between ideal high intersection 732 and non-ideal high intersection 762 and to minimize the distance between ideal low intersection 734 and non-ideal low intersection 764 by working to match the input impedance of receiver circuit 140 with the output impedance of remote driver circuit 110.

Feedback Circuit

Operation of Feedback Circuit

Figure 8:
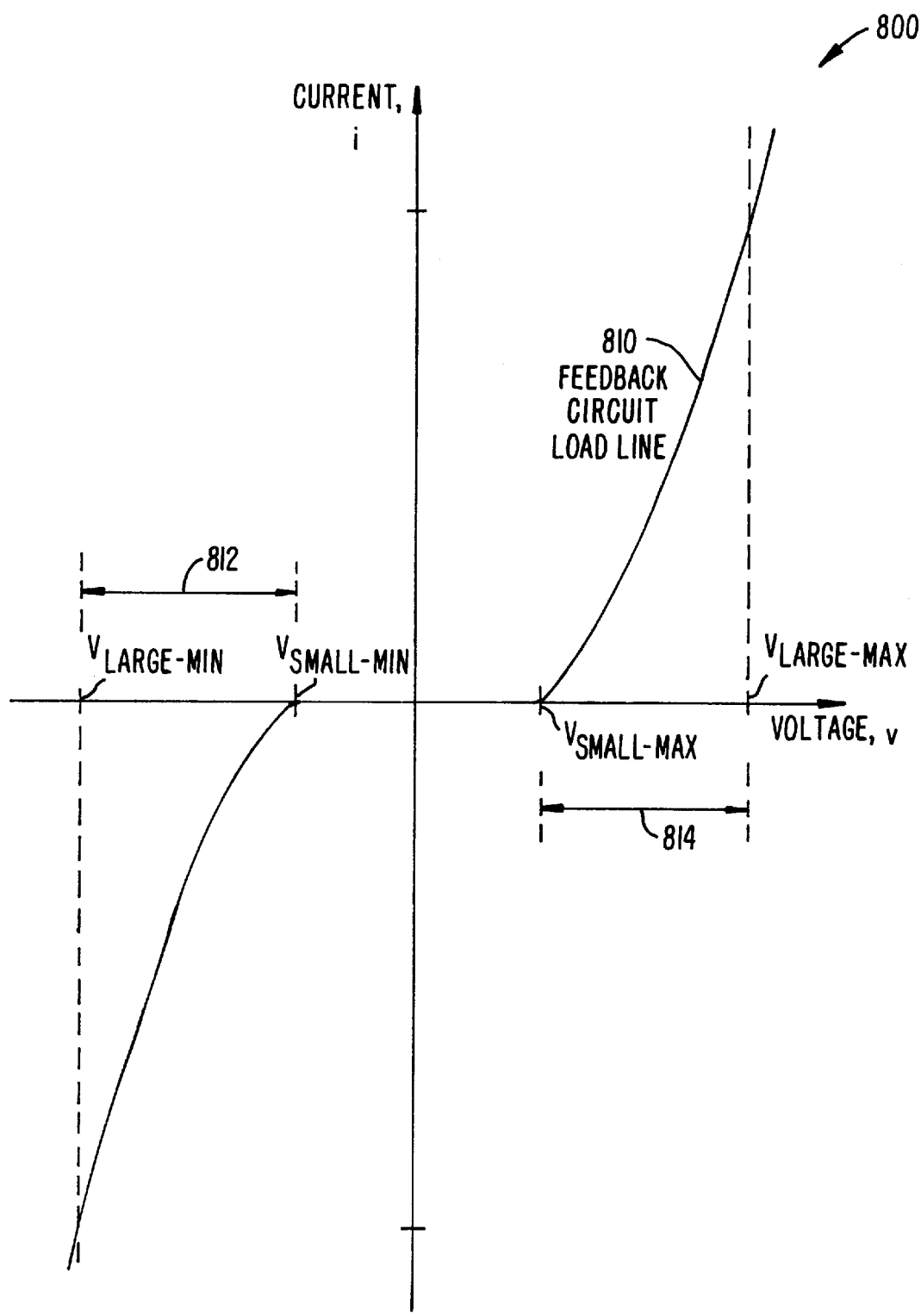
FIG. 8 shows the current-voltage characteristic of a typical feedback circuit.

FIG. 8 shows the current-voltage characteristic 800 of a typical feedback circuit 480. Current-voltage characteristic 800 includes feedback circuit load line 810. As demonstrated by feedback circuit load line 810, feedback circuit 480 creates non-linear feedback for CMOS impedance matching circuit 130, and, thereby, performs several functions.

Increases Noise Immunity Margins

The input to the impedance matching circuit provides a high impedance deadband to small signals, similarly to an ordinary CMOS inverter (amplifier). This is the region between $V_{SMALL-MIN}$ and $V_{SMALL-MAX}$. Additional noise immunity is provided by feedback circuit 480 in regions 812 and 814, beyond the deadband. The feedback circuit essentially adds resistance in parallel to the driver resistance to the induced noise current. This effectively increases the input resistance to that noise, resulting in less noise than a typical CMOS inverter (amplifier).

Clamps Maximum Excursions

Additionally, feedback circuit 480 is configured to clamp the maximum excursions on transmission line 120, thus maximizing the speed of transmission of original data signal A through the components of driver-receiver system 100 to the input of receiver circuit 140 as impedance-matched data signal, $A_{IM}$. This is also demonstrated in feedback circuit load line 810. When amplifier data signal $A_A$ has large voltage excursions of less than $V_{LARGE-MAX}$ but greater than $V_{SMALL-MAX}$, or has large voltage excursions of less than $V_{SMALL-MIN}$ but greater than $V_{LARGE-MIN}$, feedback circuit 480 has a very low input impedance and, thus, conducts much current, i. However, since amplifier 410 outputs amplifier data signal, $A_A$ which is limited in its voltage levels to be within the compliance range of the supply voltage of remote driver circuit 110, amplifier 410 can source and sink only a limited amount of current. Therefore, for the maximum currents which can be sourced and sinked by amplifier 410, feedback circuit 480 clamps the maximum voltage excursions of amplifier data signal $A_A$ to $V_{LARGE-MAX}$ and $V_{LARGE-MIN}$, and, consequently, generates and outputs a clamped feedback data signal, $A_{FB}$. In effect, feedback circuit 480 acts as a low impedance clamp, thus essentially clamping the maximum voltage excursions of amplifier data signal $A_A$. In other words, since feedback circuit 480 has low impedance for the large voltage excursions of amplifier data signal $A_A$, feedback circuit 480 limits the maximum voltage and the minimum voltage which it allows to pass through itself for the currents which are sourced and sinked, respectively, by amplifier circuit 410, and, consequently, generates and outputs a clamped feedback data signal, $A_{FB}$.

Biases to Trigger Level

Additionally, feedback circuit 480, is configured to bias transmission line 120 to the trigger level of remote receiver circuit 140 in the absence of an input signal. This is demonstrated in feedback circuit load line 810. In the operation of CMOS impedance matching circuit 130, amplifier data signal $A_A$ experiences large changes in voltages from $V_{LARGE-MAX}$ to $V_{LARGE-MIN}$. When amplifier 410 receives no transmission data signal $A_T$, in other words no input, amplifier data signal $A_A$ may be held at or near either $V_{LARGE-MAX}$ or $V_{LARGE-MIN}$. In such a case, with no transmission data signal $A_T$, and, subsequently, with a very low current in amplifier data signal $A_A$, feedback circuit 480 generates a feedback data signal, $A_{FB}$ which is at or near the trigger level of remote receiver circuit 140. Specifically, in feedback circuit load line 810, feedback data signal, $A_{FB}$ is held between $V_{SMALL-MAX}$ and $V_{SMALL-MIN}$, and, very close to zero volts. In this way, feedback circuit 480 biases transmission line 120 to the voltage trigger level of remote receiver circuit 140 where remote receiver circuit receives data, in the form of impedance-matched data signal, $A_{IM}$, between $V_{LARGE-MAX}$ to $V_{LARGE-MIN}$.

Detailed Description of Feedback Circuit

Figure 6A:
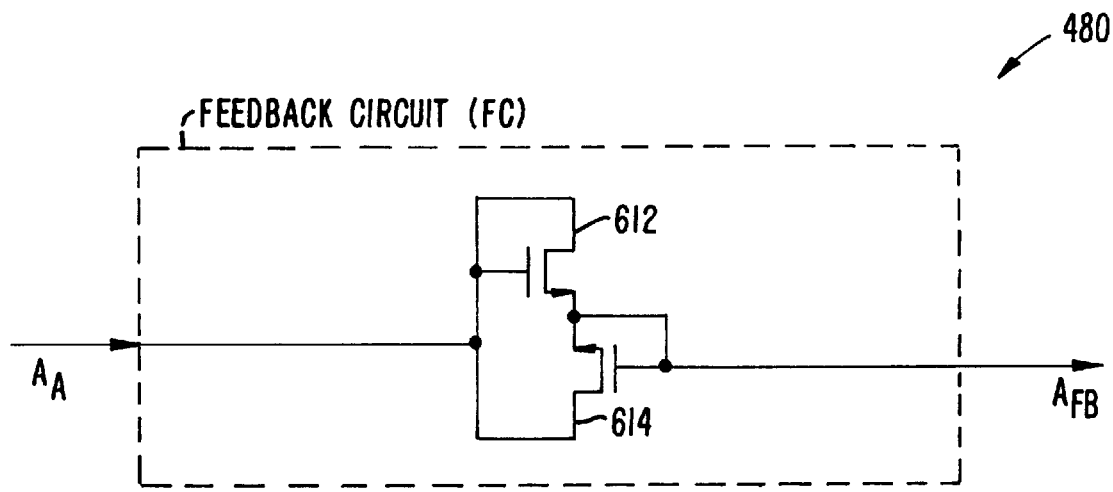
FIGS. 6A–6H are circuit diagrams of eight embodiments of the feedback circuit of FIG. 4.

FIGS. 6A–6H show circuit diagrams of eight embodiments of the feedback circuit 480 of FIG. 4. FIG. 6A shows a circuit diagram of a first type of feedback circuit 480. First type of feedback circuit 480 includes a first NMOS transistor 612 and a second NMOS transistor 614. First NMOS transistor 612 and second NMOS transistor 614 are configured as back to back diodes.

Figure 6B:
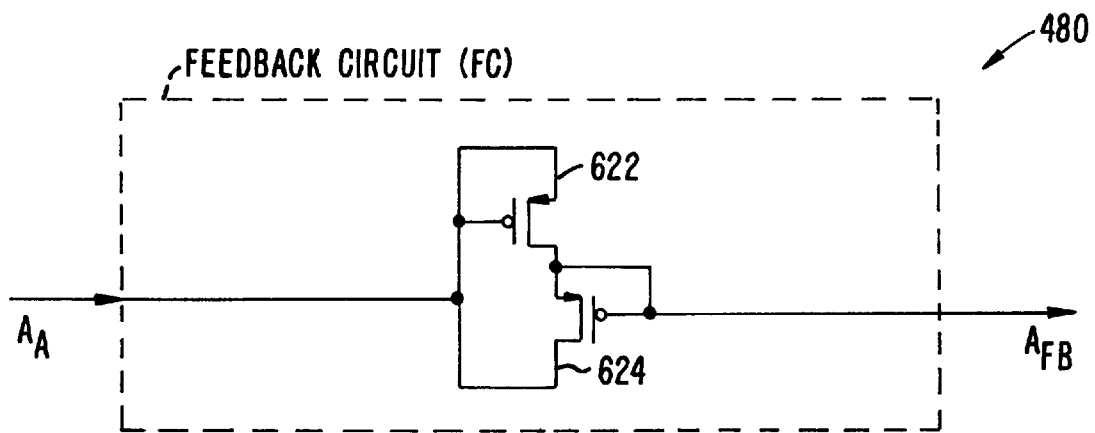

FIG. 6B shows a circuit diagram of a second type of feedback circuit 480. Second type of feedback circuit 480 includes a first PMOS transistor 622 and a second PMOS transistor 624. First PMOS transistor 622 and second PMOS transistor 624 are configured as back to back diodes.

Figure 6C:
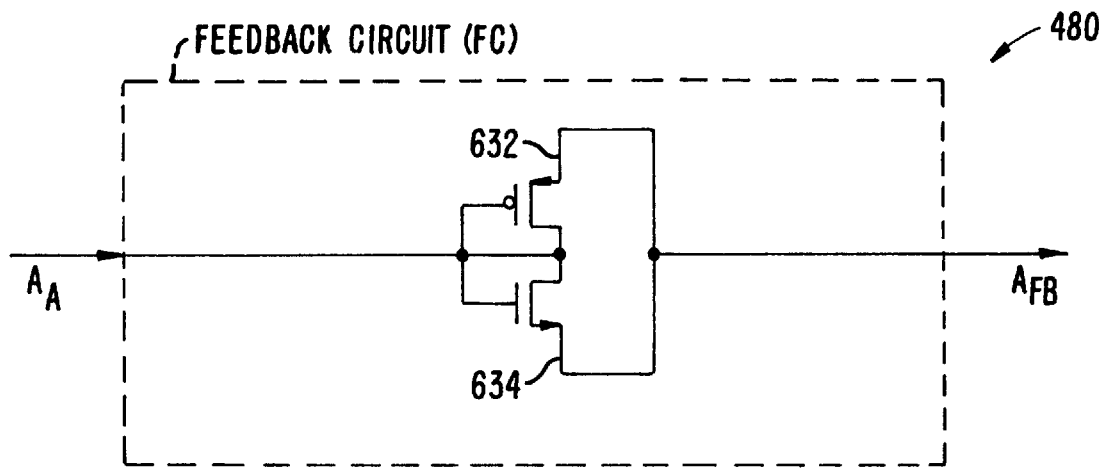

FIG. 6C shows a circuit diagram of a third type of feedback circuit 480. Third type of feedback circuit 480 includes a PMOS transistor 632 and an NMOS transistor 634. PMOS transistor 632 and NMOS transistor 634 are configured as back to back diodes.

Figure 6D:
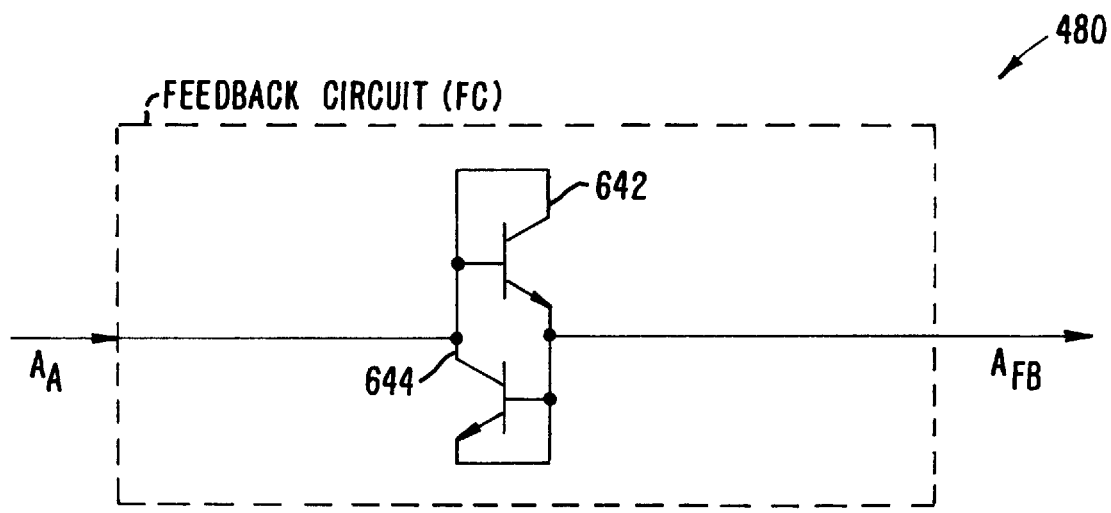

FIG. 6D shows a circuit diagram of a fourth type of feedback circuit 480. Fourth type of feedback circuit 480 includes a first NPN bipolar transistor 642 and a second NPN bipolar transistor 644. First NPN bipolar transistor 642 and second NPN bipolar transistor 644 are configured back to back.

Figure 6E:
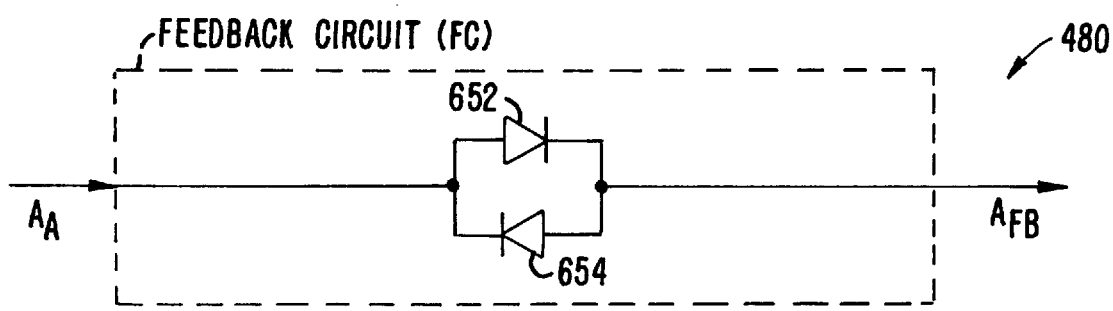

FIG. 6E shows a circuit diagram of a fifth type of feedback circuit 480. Fifth type of feedback circuit 480 includes a first PN diode 652 and a second PN diode 654. First PN diode 652 and second PN diode 654 are configured back to back.

Figure 6F:
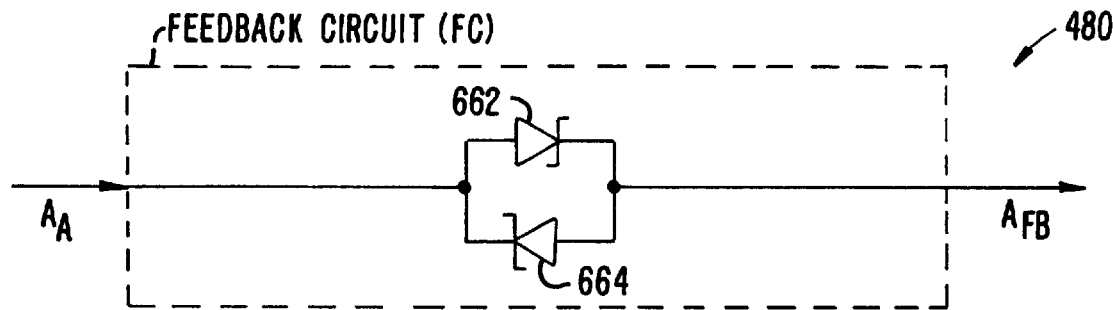

FIG. 6F shows a circuit diagram of a sixth type of feedback circuit 480. Sixth type of feedback circuit 480 includes a first Schottky diode 662 and a second Schottky diode 664. First Schottky diode 662 and second Schottky diode 664 are configured back to back.

Figure 6G:
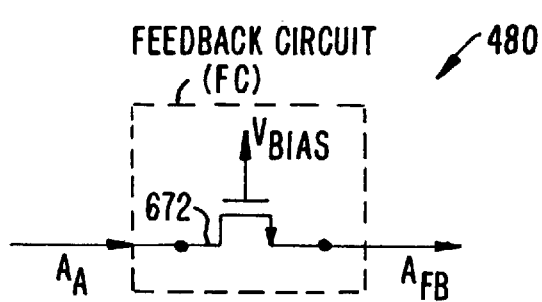

FIG. 6G shows a circuit diagram of a seventh type of feedback circuit 480 Seventh type of feedback circuit 480 includes a biased NMOS transistor 672.

Figure 6H:
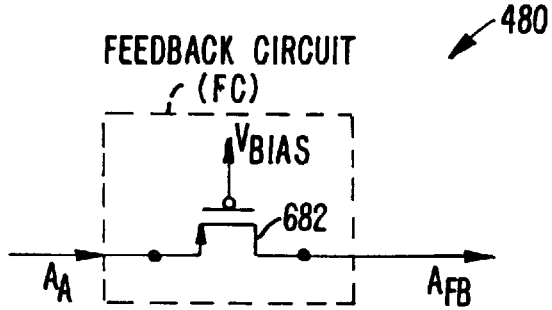

FIG. 6H shows a circuit diagram of an eighth type of feedback circuit 480 Eighth type of feedback circuit 480 includes a biased PMOS transistor 682.

Transient Characteristics of Driver-Receiver Systems

Figure 9A:
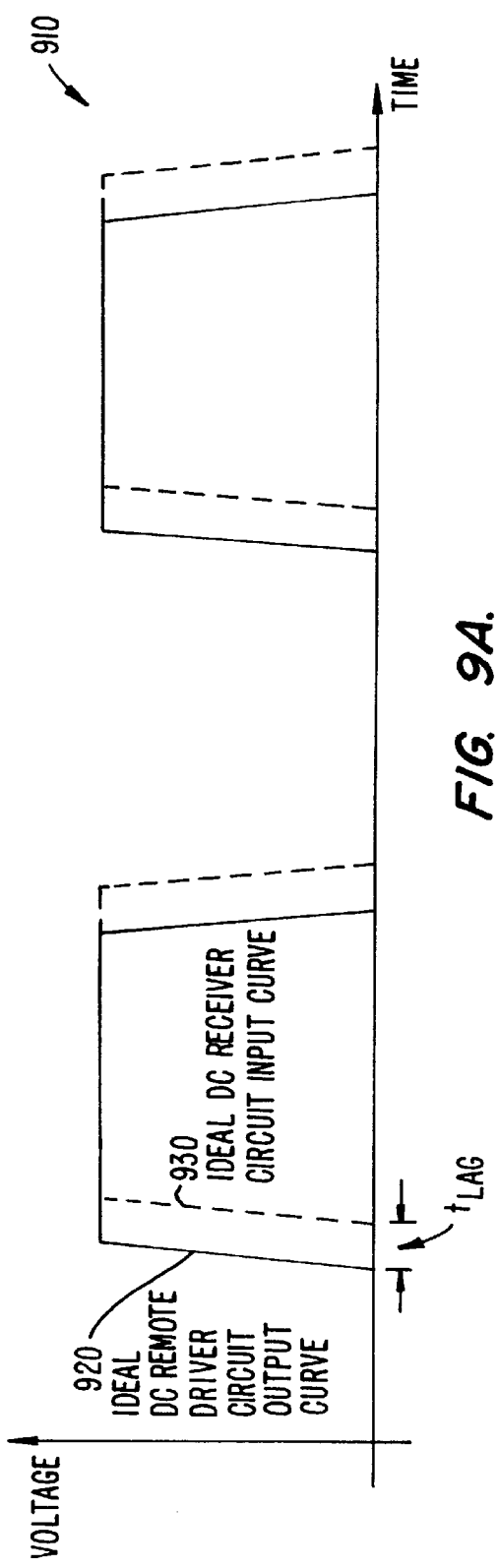
FIG. 9A shows the ideal transient characteristic for an ideal driver-receiver system.

FIG. 9A shows the ideal transient characteristic 910 for an ideal driver-receiver system. Ideal characteristic 910 includes an ideal transient remote driver circuit output curve 920 (the curve of driver data signal, $A_D$) and an ideal receiver circuit input curve 930 (the curve of impedance-matched data signal, $A_{IM}$). Ideal transient receiver circuit input curve 930 lags ideal remote driver circuit output curve 920 by time delay $t_{LAG}$, but, traces the same voltage levels as ideal remote driver circuit output curve 920.

Figure 9B:
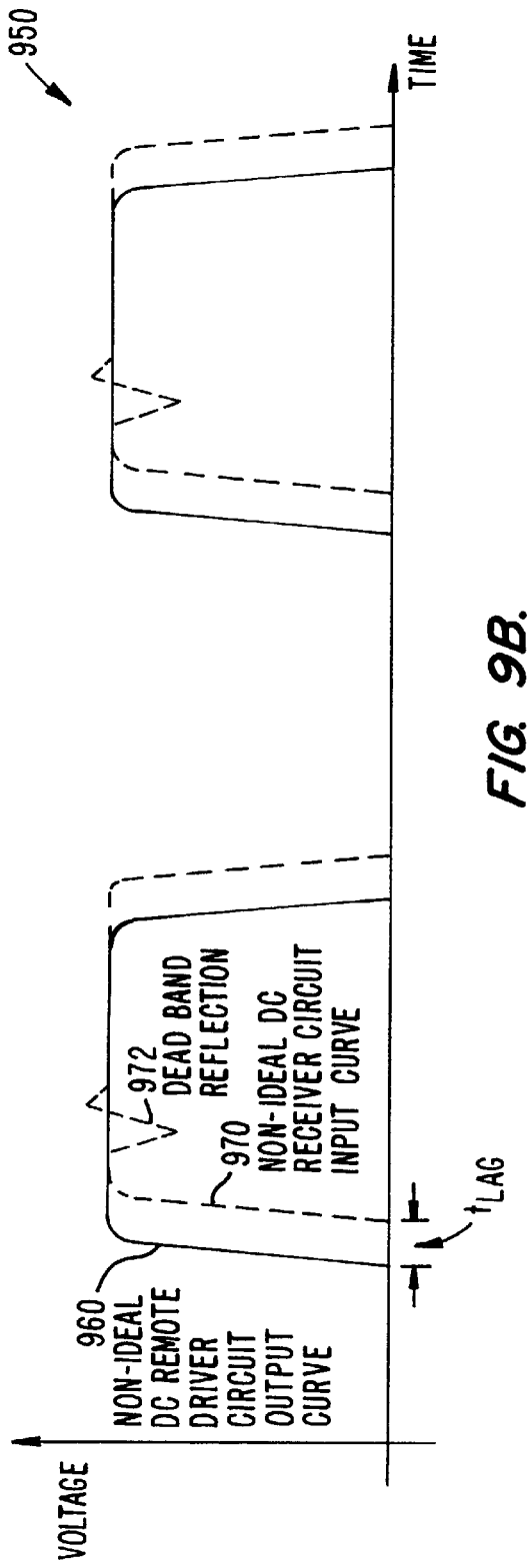
FIG. 9B shows the non-ideal transient characteristic for non-ideal driver-receiver system.

FIG. 9B shows the non-ideal transient characteristic 950 for non-ideal driver-receiver system 100. Non-ideal characteristic 950 includes a non-ideal remote driver circuit curve 960 and a non-ideal receiver circuit curve 970. Non-ideal receiver circuit curve 970 lags non-ideal remote driver circuit curve 960 also by time delay $t_{LAG}$. However, non-ideal receiver circuit curve 970 only partially has the same voltage levels as non-ideal remote driver circuit curve 960, in that non-ideal receiver circuit curve 970 has some dead band reflection 972. CMOS impedance matching circuit 130 minimizes dead band reflection 972 by significantly matching the input impedance of receiver circuit 140 with the characteristic impedance of transmission line 120, and, thus, terminating transmission line 120 properly. Amplifier 410 helps to minimize dead band reflection 972 by generating and outputting amplifier data signal $A_A$ which is within the compliance of remote driver circuit 110. Feedback circuit 480 helps to minimize dead band reflection 972 by generating and outputting a clamped feedback data signal, $A_{FB}$.

The invention has been explained with reference to a specific embodiment.

Other embodiments will be apparent to those of ordinary skill in the art. It is therefore not intended that this invention be limited, except as indicated by the appended claims.

What is claimed is:

1. A CMOS impedance matching circuit for coupling to a remote driver circuit via a transmission line and for coupling to a receiver circuit, said CMOS impedance matching circuit comprising:

an amplifier having an amplifier input coupled to a CMOS impedance matching circuit input, a plurality of control inputs, and an amplifier output, said amplifier having a gain which is modifiable in accordance with control signals on said control inputs, such that an input impedance of said receiver circuit substantially matches an output impedance of said remote driver circuit and a characteristic impedance of said transmission line;

a feedback circuit having an input coupled to said amplifier output and an output coupled to said CMOS impedance matching circuit input; and a CMOS impedance matching circuit output coupled to said output of said feedback circuit and to said CMOS impedance matching circuit input.

2. The CMOS impedance matching circuit of claim 1 further comprising an impedance buffer coupled between said CMOS impedance matching circuit input and said CMOS impedance matching circuit output.

3. The CMOS impedance matching circuit of claim 1 wherein said amplifier comprises:

an amplifier circuit having a plurality of switchable amplifiers coupled in parallel with each other, each of said switchable amplifiers is independently selectable by said control inputs; and an amplifier buffer in parallel with said amplifier circuit.

4. The CMOS impedance matching circuit of claim 3 wherein each of said switchable amplifiers has a different gain.

5. The CMOS impedance matching circuit of claim 3 wherein each of said switchable amplifiers comprises:

a pull up circuit, wherein said pull up circuit is coupled to a first supply voltage, to one of said control inputs, to said amplifier input, and to said amplifier output; and a pull down circuit, wherein said pull down circuit is coupled to a second supply voltage, to one of said control inputs, to said amplifier input, and to said amplifier output.

6. The CMOS impedance matching circuit of claim 5 wherein said pull up circuit comprises:

a first transistor of a first polarity having a source coupled to said first supply voltage, a gate coupled to said one of said control inputs, and a drain;

a second transistor of a second polarity having a drain coupled to said drain of said first transistor, a gate coupled to said one of said control inputs, and a source coupled to said amplifier input; and a third transistor of said first polarity having a source coupled to said first supply voltage, a gate coupled to said drain of said first transistor and to said drain of said second transistor, and a drain coupled to said amplifier output.

7. The CMOS impedance matching circuit of claim 5 wherein said pull-down circuit comprises:

a first transistor of a first polarity having a source coupled to said amplifier input, a gate coupled to said one of said control inputs, and a drain;

a second transistor of a second polarity having a drain coupled to said drain of said first transistor, a gate coupled to said one of said control inputs, and a source coupled to said second supply voltage; and a third transistor of said second polarity having a drain coupled to said amplifier output, a gate coupled to said drain of said first transistor and to drain of said second transistor, and a source coupled to said second supply voltage.

8. The CMOS impedance matching circuit of claim 5 wherein said first supply voltage is within a compliance range of a supply voltage of said remote driver circuit and wherein said second supply voltage is within said compliance range of said supply voltage of said remote driver circuit.

9. The CMOS impedance matching circuit of claim 5 wherein said first supply voltage is a positive supply voltage and wherein said second supply voltage is a negative supply voltage.

10. The CMOS impedance matching circuit of claim 5 wherein said first supply voltage is a positive supply voltage and wherein said second supply voltage is ground.

11. The CMOS impedance matching circuit of claim 3 wherein each of said switchable amplifiers has transistors of different sizes such that each of said switchable amplifiers has a different gain from the other switchable amplifiers, thereby providing said gain which is modifiable.

12. The CMOS impedance matching circuit of claim 1 wherein said feedback circuit has a high impedance to small signals, thereby increasing noise immunity margins of said CMOS impedance matching circuit.

13. The CMOS impedance matching circuit of claim 1 wherein said feedback circuit clamps maximum excursions on said transmission line.

14. The CMOS impedance matching circuit of claim 1 wherein said feedback circuit biases said transmission line to a trigger level of said remote receiver circuit in the absence of an input signal.

15. The CMOS impedance matching circuit of claim 1 wherein said feedback circuit is one of (a) two NMOS transistors configured as back to back diodes, (b) two PMOS transistors configured as back to back diodes, (c) one PMOS transistor and one NMOS transistor configured as back to back diodes, (d) two NPN bipolar transistors configured back to back, (e) two PN diodes configured back to back, (f) two Schottky diodes configured back to back, (g) a biased NMOS transistor, and (h) a biased PMOS transistor.

* * * * *

UNITED STATES PATENT AND TRADEMARK OFFICE
CERTIFICATE OF CORRECTION

PATENT NO.    : 6,313,659 B1
DATED         : November 6, 2001
INVENTOR(S)   : Bosnyak et al.

Page 1 of 1

It is certified that error appears in the above-identified patent and that said Letters Patent is hereby corrected as shown below:

<u>Title page,</u>
Item [22], please correct the filing date as follows:
-- [22] Filed: Sep. 22, 2000 --

Signed and Sealed this

Nineteenth Day of August, 2003

JAMES E. ROGAN
*Director of the United States Patent and Trademark Office*